(12) United States Patent  (10) Patent No.: US 7,466,294 B2
Yamazaki et al.  (45) Date of Patent: Dec. 16, 2008

(54) LIGHT EMITTING DEVICE AND ELECTRIC APPLIANCE

(75) Inventors: Shunpei Yamazaki, Tokyo (JP);
Hiromichi Godo, Kanagawa (JP);
Junichiro Sakata, Kanagawa (JP);
Kaoru Tsuchiya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 639 days.

(21) Appl. No.: 10/786,813

(22) Filed: Feb. 25, 2004

(65) Prior Publication Data

US 2004/0169624 A1    Sep. 2, 2004

(30) Foreign Application Priority Data

Feb. 28, 2003    (JP)    ............................. 2003-053944

(51) Int. Cl.
*G09G 3/32*    (2006.01)
(52) U.S. Cl. .............................. 345/83; 345/4; 345/76; 313/506; 313/519
(58) Field of Classification Search .................. 345/82, 345/83, 76, 4; 313/509, 501, 506, 113, 503, 313/519, 521
See application file for complete search history.

(56) References Cited

U.S. PATENT DOCUMENTS

| 5,507,404 | A | * | 4/1996 | Ryu ............................ 313/509 |
| 5,703,436 | A | * | 12/1997 | Forrest et al. ................ 313/506 |
| 5,891,554 | A | | 4/1999 | Hosokawa et al. ........... 428/212 |
| 6,124,024 | A | | 9/2000 | Hosokawa et al. ........... 428/212 |
| 6,221,520 | B1 | | 4/2001 | Takaki et al. |
| 6,373,453 | B1 | | 4/2002 | Yudasaka |
| 6,465,117 | B2 | | 10/2002 | Takaki et al. |
| 6,608,449 | B2 | | 8/2003 | Fukunaga |
| 6,614,174 | B1 | * | 9/2003 | Urabe et al. ................. 313/504 |
| 6,911,772 | B2 | * | 6/2005 | Cok ............................ 313/501 |
| 7,116,044 | B2 | | 10/2006 | Fukunaga |
| 7,176,858 | B2 | | 2/2007 | Iwabuchi et al. |

(Continued)

FOREIGN PATENT DOCUMENTS

EP    0 940 796 A1    9/1999

(Continued)

OTHER PUBLICATIONS

Eldis Group, "Exhibition of Active Matrix Type Organic EL Display at '13th Flat Panel Display Manufacturing Technology Expo & Conference'," Japan; with English translation, Jul. 2, 2003.

(Continued)

*Primary Examiner*—Kevin M Nguyen
(74) *Attorney, Agent, or Firm*—Cook Alex Ltd.

(57) ABSTRACT

When materials of a cathode and an anode are transparent and a substrate with transparency is used for a substrate and a sealing substrate, luminescence from a layer including an organic compound can simultaneously perform two ways of display: luminescence passing a cathode and luminescence transmitted in an anode. However, interference effect by an optical distance difference results in difference in optical characteristics (such as a color tone) between luminescence from a top surface and luminescence from a bottom surface. According to the present invention, a light-emitting device having luminescence from a top surface and luminescence from a bottom surface provides both luminescence to a top surface and luminescence to a bottom surface with an image display having an uniform color tone and of high quality by regulating a film thickness of a transparent conductive film disposed on a cathode side and a film thickness of a cathode.

27 Claims, 7 Drawing Sheets

U.S. PATENT DOCUMENTS

| | | | |
|---|---|---|---|
| 7,176,861 B2 * | 2/2007 | Dedene et al. | 345/83 |
| 7,195,826 B2 | 3/2007 | Kido et al. | |
| 7,199,520 B2 | 4/2007 | Fujii et al. | |
| 7,333,077 B2 | 2/2008 | Koyama et al. | |
| 7,355,338 B2 | 4/2008 | Osame et al. | |
| 2001/0048982 A1 | 12/2001 | Kido et al. | |
| 2002/0075207 A1 | 6/2002 | Yudasaka | |
| 2003/0063243 A1 | 4/2003 | Roosendaal et al. | |
| 2003/0170423 A1 * | 9/2003 | Katsumoto et al. | 428/141 |
| 2003/0206144 A1 | 11/2003 | Yudasaka | |
| 2004/0124542 A1 | 7/2004 | Kuwabara et al. | 257/778 |
| 2004/0140547 A1 | 7/2004 | Yamazaki et al. | 257/686 |
| 2004/0169624 A1 | 9/2004 | Yamazaki et al. | |
| 2004/0212012 A1 | 10/2004 | Yamazaki et al. | 257/347 |
| 2004/0239231 A1 | 12/2004 | Miyagawa et al. | 313/438 |
| 2004/0239658 A1 | 12/2004 | Koyama et al. | 345/204 |
| 2004/0245529 A1 | 12/2004 | Yamazaki et al. | 257/79 |
| 2004/0245531 A1 | 12/2004 | Fuii et al. | 257/88 |
| 2004/0263425 A1 | 12/2004 | Anzai et al. | 345/1.1 |
| 2005/0001211 A1 | 1/2005 | Yamazaki et al. | 257/52 |
| 2005/0040753 A1 | 2/2005 | Osame et al. | 313/500 |
| 2005/0052142 A1 | 3/2005 | Iwabuchi et al. | 315/169.3 |
| 2007/0018572 A1 | 1/2007 | Fukunaga | |
| 2007/0164257 A1 | 7/2007 | Kido et al. | |
| 2008/0036699 A1 | 2/2008 | Yudasaka | |

FOREIGN PATENT DOCUMENTS

| | | |
|---|---|---|
| EP | 1 524 696 A2 | 4/2005 |
| JP | 8-185984 | 7/1996 |
| JP | 11-65487 | 3/1999 |
| JP | 11-70610 | 3/1999 |
| JP | 11-281967 | 10/1999 |
| JP | 2002-25779 | 1/2002 |
| JP | 2002-33198 | 1/2002 |
| JP | 2002-289358 | 10/2002 |
| JP | 2003-142277 | 5/2003 |
| JP | 3408154 | 5/2003 |
| JP | 2004-265691 | 9/2004 |

OTHER PUBLICATIONS

Semiconductor Energy Labs (SEL), Documents distributed at the "13th Flat Panel Display Manufacturing Technology Expo & Conference," Japan, by the ELDis Group, with English translation, (2003).

"Mass Production of Organic EL Devices: ELDis in Tsuga goes all out to promote the use of EL device for cellular phones, and aims at a full-scale production by 2004," Shimotsuke Newspaper, Japan, with English translation, Jul. 3, 2003.

AFP-JIJI, "Two-way display developed," The Japan Times, Japan, Jul. 3, 2003.

* cited by examiner

| ANODE SIDE | THICKNESS(nm) | | CATHODE SIDE | THICKNESS(nm) |
|---|---|---|---|---|
| 0 LAYER(LIGHT EMITTING LAYER) | 0 | | 0 LAYER(LIGHT EMITTING LAYER) | 0 |
| 1st (HTL / HIL) | 33 | | 1st LAYER(ETL / EIL) | 90 |
| 2nd(ITO) | 110 | | 2nd LAYER(Ag) | 8 |
| 3rd(SP-SiN) | 100 | | 3rd LAYER(ITO) | 260 |
| 4th(ACRYLIC RESIN) | 1000 | | 4th LAYER(SP-SiN) | 100 |
| 5th(SiNO) | 100 | | 5th LAYER(AIR) | 0 |
| 6th(GI) | 110 | | GLASS SUBSTRATE | |
| 7th(SiON) | 100 | | | |
| 8th(SiNO) | 50 | | | |
| GLASS SUBSTRATE | | | | |

▓ TFT PORTION

LAMINATED STRUCTURE
ANODE LAYER TFT \ ITO \ EL(HIL \ HTL \ EML) \ EL(EML \ ETL \ EIL) \ Ag \ ITO \ SP-SiN  CATHODE LAYER

↑ LIGHT EMITTING LAYER

*FIG. 2*

LIGHT EMITTING DEVICE AND ELECTRIC APPLIANCE

BACKGROUND OF THE INVENTION

1. Field of the Invention

The present invention relates to a light-emitting device with the use of a light-emitting element in which a film including an organic compound (hereinafter, referred to as an "organic compound layer") disposed between a pair of electrode is provided fluorescence or phosphorescence by applying an electric field, and a method for manufacturing the light-emitting device. A light-emitting device in the present specification may include an image display device, a light-emitting device, or a light source (including a lighting system). In addition, a module that a connector, for example, a FPC (Flexible Printed Circuit), a TAB (Tape Automated Bonding) tape, or a TCP (Tape Carrier Package) is installed in the light-emitting device, a module that a printed wiring board is provided at an end of a TAB tape and a TCP, and a module that an IC (integrated circuit) is mounted directly in the light-emitting device by a COG (Chip On Glass) method are all included in the light-emitting device.

2. Description of the Related Art

In recent years, research related to a light-emitting device having an EL device as a self-luminous light-emitting device has been activated. The light emitting device is also referred to as an organic EL display or an organic light-emitting diode. Since these light-emitting devices have characteristics such as rapid response speed that is suitable for a moving picture display, low voltage, low power consumption driving, they attracts an attention for next generation displays including new-generation mobile phones and portable information terminals (PDA).

The EL device comprises an anode, a cathode, and a layer containing an organic compound generating luminescence (electroluminescence) by applying an electric field (hereinafter, referred to as an EL layer). As luminescence generated in an organic compound, there are luminescence (fluorescence) generated by reverting an excited singlet state to a ground state and luminescence (phosphorescence) generated by reverting an excited triplet state to a ground state. The luminescence radiation is allowed to take place by reverting from either state to the ground state in the light-emitting device manufactured by a fabrication system and a film forming method according to the present invention.

The light-emitting device has no viewing angle difficulty for its self-luminous property differently from a liquid crystal display device. Thus the light emitting device is more suitable for using at outside than the liquid crystal display device. Various types of usage are proposed for the light-emitting device.

In the specification, a light-emitting element formed of a cathode, an EL layer, and an anode is referred to as an EL element. There are two kinds for forming the EL device; a simple matrix that an EL layer is formed between two kinds of striped electrodes being perpendicular to each other, or an active matrix that an EL layer is formed between a pixel electrode and a counter electrode arranged in matrix that are connected to a thin film transistor (hereinafter: TFT). When a pixel density is increased, the active matrix is considered to have an advantage over the simple matrix because the active matrix can drive at low voltage for having a switch in each pixel (or each dot).

Conventionally, an organic EL element that a thickness of a layer including an anode and a plurality of organic compounds is set so that predetermined wave length of light provided from an EL layer becomes peak wave-length is disclosed, for example, in light-emitting device having luminescence transmitted in a cathode and luminescence transmitted in an anode from three light-emitting devices (red, green, and blue) that materials of a cathode and an anode are transparent, wherein each of luminescence transmitted in a cathode and luminescence transmitted in an anode are the same in color coordinate.

The luminescence transmitted in a cathode and an anode passes various layers or substrates. For example, in the case of an active matrix type light-emitting device, number of laminated layers to be passed from a luminous point are different because a switching device such as a TFT is disposed on a cathode side or an anode side and an interlayer insulating film (a silicon nitride film and an organic resin film) of a TFT is formed on a cathode side or an anode side. When a sealing substrate is pasted to a device substrate, a distance from a luminous point to an element substrate and a distance from a luminous point to the surface of the sealing substrate surface are also different. These factors cause a difference in a color tone of luminescence.

The present invention realizes a light-emitting device providing both luminescence to a top surface and luminescence to a bottom surface with an image display having an uniform color tone and high quality by adjusting a film thickness of a transparent conductive film and a film thickness of a cathode.

Constitution of the invention disclosed in the present specification provides a light-emitting device comprising: a pixel portion having a plurality of light-emitting elements of three kinds (red, green, and blue) having a transparent first electrode, a layer including an organic compound over the first electrode, and a transparent second electrode over the layer including the organic compound, wherein luminescence of three colors of red, green, and blue form the same triangles in a color coordinate as for both luminescence passing a first electrode and luminescence passing a second electrode. Reference 1. (Reference 1: Japanese Patent No.2846571)

When materials of a cathode and an anode are transparent and a substrate and a sealing substrate are transparent, luminescence from a layer including an organic compound can simultaneously perform two ways of display: luminescence transmitted in a cathode and luminescence transmitted in an anode.

However, the difference in optical characteristics (such as a color tone) between luminescence from a top surface and luminescence from a bottom surface arise for an interference effect by a difference of an optical distance. When a light-emitting device (an EL device) of three kinds (red, green, and blue) that materials of a cathode and an anode are transparent is used to manufacture a light-emitting display device of full color, problem that a color coordinate is different between luminescence from a top surface and luminescence from the bottom surface arises as shown in FIG. 8. If a color coordinate is different, the same gradation display in the top surface and the bottom surface is impossible.

A film thickness of such as an anode, a cathode, a protective film, and a layer including an organic compound in RGB is required to be controlled respectively in the case of full color, because an optical distance is different depending on each wavelength.

SUMMARY OF THE INVENTION

The present invention provides a light-emitting device providing both luminescence to a top surface and luminescence to a bottom surface with an image display having an uniform color tone and high quality in a light-emitting device (an EL element) where materials of a cathode and an anode are transparent.

In order to solve the above-described problem, the present invention provides a

The present invention is not limited to a light-emitting device of a full color display with the use of three kinds of light-emitting devices, and another constitution of the invention provides a light-emitting device comprising: a pixel portion having a plurality of light-emitting elements of white color having a transparent first electrode, a layer including an organic compound over the first electrode, and a transparent second electrode over the layer including the organic compound and two color filters which sandwich the light-emitting element, wherein transmitted light of three colors transmitted in a color filter form the same triangles in a color coordinate as for both luminescence passing a first electrode and luminescence passing a second electrode.

By adjusting materials, film thickness, and the like of the two color filters to be varied from one another, the transmitted light of three colors transmitted through the color filters can form the same triangles in a color coordinate on both the first electrode side and the second electrode side.

In addition, a light-emitting element of blue and a color conversion layer may be used, and other constitution of the invention is a light-emitting device comprising: a pixel portion having a plurality of light-emitting elements of blue color having a transparent first electrode, a layer including an organic compound over the first electrode, and a transparent second electrode over the layer including the compound; and color conversion layers which sandwich the light-emitting element, wherein transmitted light of red and green transmitted in a color conversion layer and luminescence of blue form the same triangles in a color coordinate as for both luminescence passing a first electrode and luminescence passing a second electrode.

By adjusting materials, film thickness, and the like of the two color filters to be varied from one another, the transmitted light of three colors transmitted through a color conversion layer can form the same triangles in a color coordinate on both the first electrode side and the second electrode side.

In each of the above-described constitution, the first electrode and the second electrode are characterized by being a cathode or an anode of a light-emitting element that a layer including an organic compound is a light-emitting layer.

In each of the above-described constitution, it is characterized that the number of the layers which light transmitted in the first electrode transmits and the number of the layers which light transmitted in the second electrode transmits is different. In the case of an active matrix type light transmits the substrate where is formed such as an interlayer insulating film, a gate insulating film, and a protective film of the TFT The TFT is connected to the first electrode or the second electrode.

In each of the above-described constitution, the first electrode or the second electrode is a transparent conductive film or a metal thin film transmitting light.

As shown in FIGS. 6A and 6B, in a dual emission (both top and bottom emissions) type light-emitting device, two pieces of polarizing plates are disposed sandwiching a light-emitting panel so that a direction of polarization is to be perpendicular thereto, thereby preventing a display from being hard to be recognized because of transparency to see a background when watched from one side.

BRIEF DESCRIPTION OF THE DRAWINGS

FIG. 2 is a diagram showing a film thickness of each laminated layers in an EL device. (Embodiment Mode)

Embodiment 1

Figure 5A:
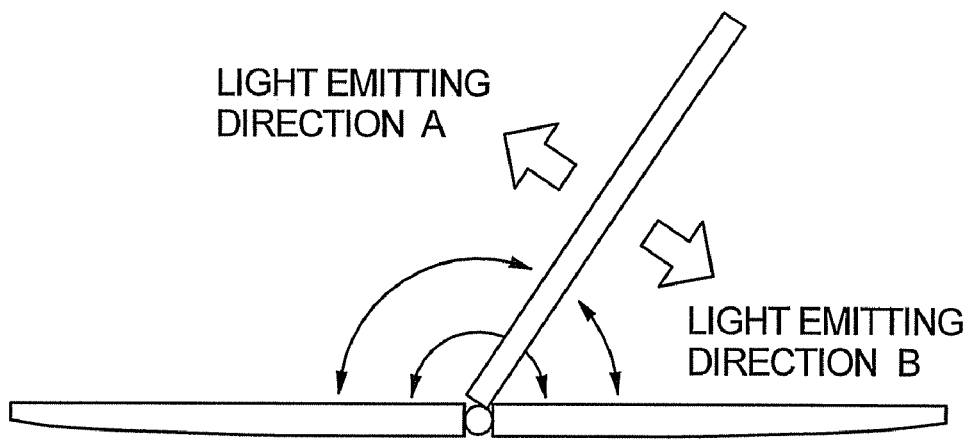
Figure 5B:
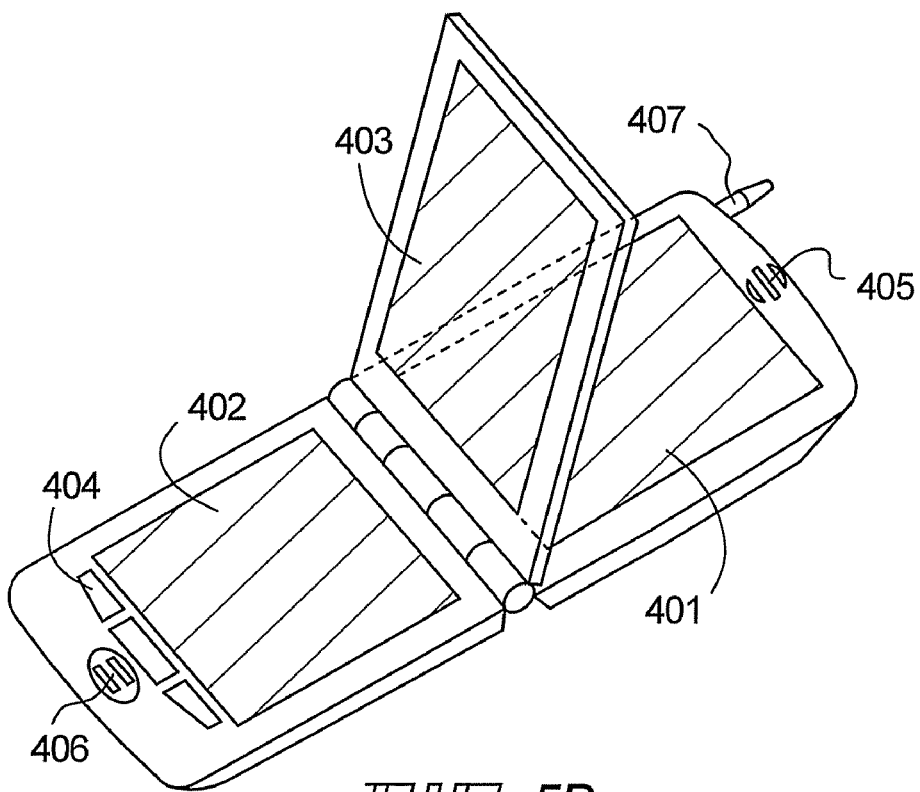

FIGS. 5A and 5B are diagrams showing a portable electric appliance.

Embodiment 2

Figure 6A:
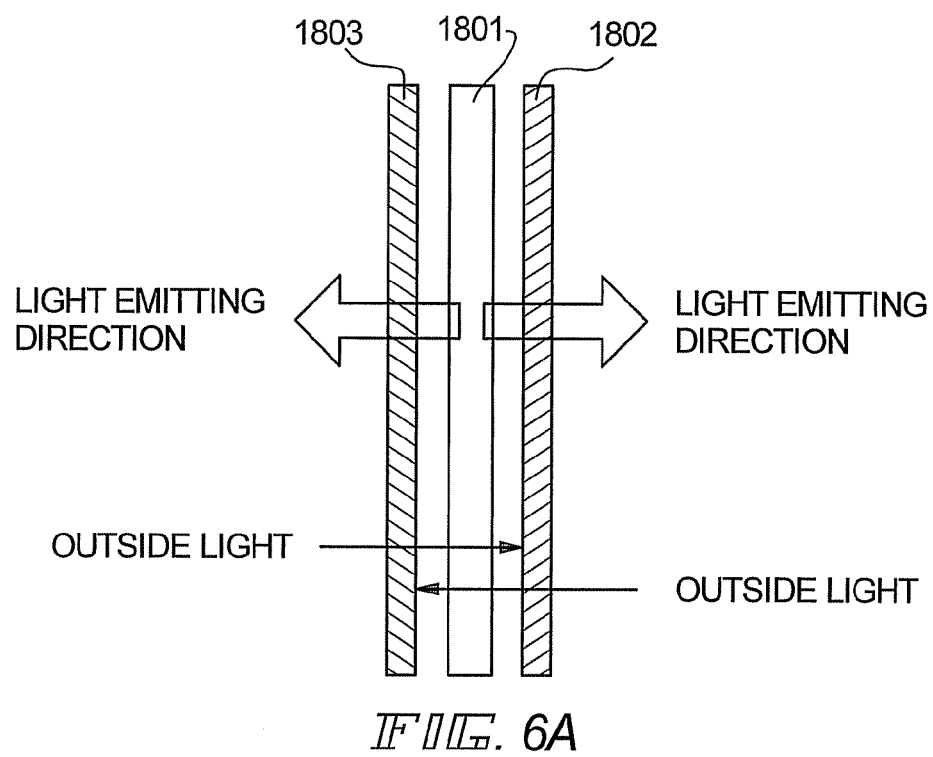
Figure 6B:
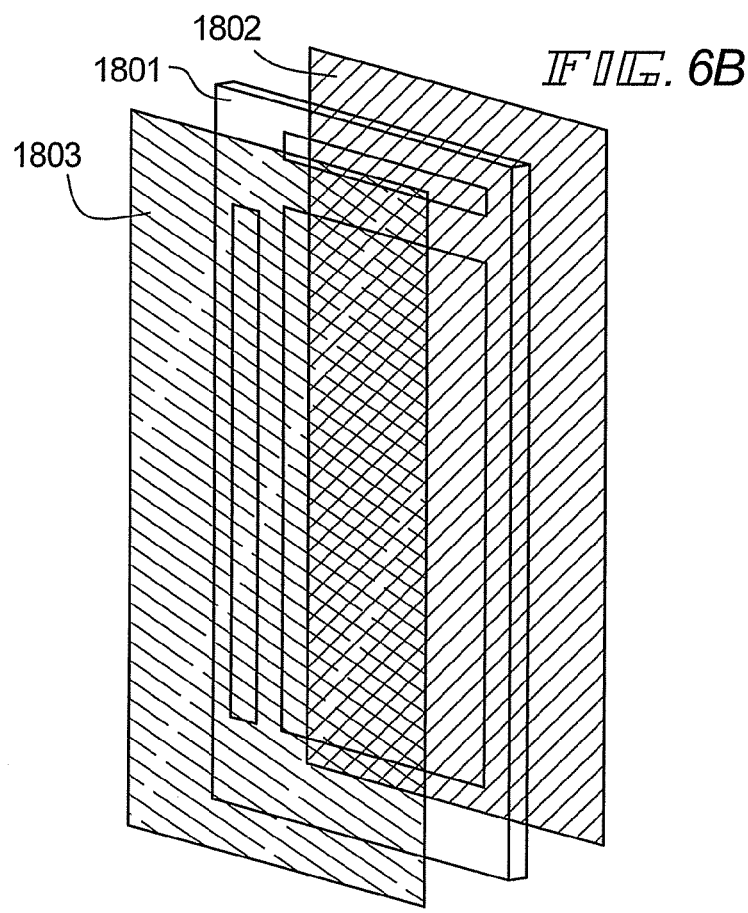

FIGS. 6A and 6B are diagrams showing a cross-sectional view and a perspective view of a light-emitting device provided with an optical film. (Embodiment 3)

Figure 7:
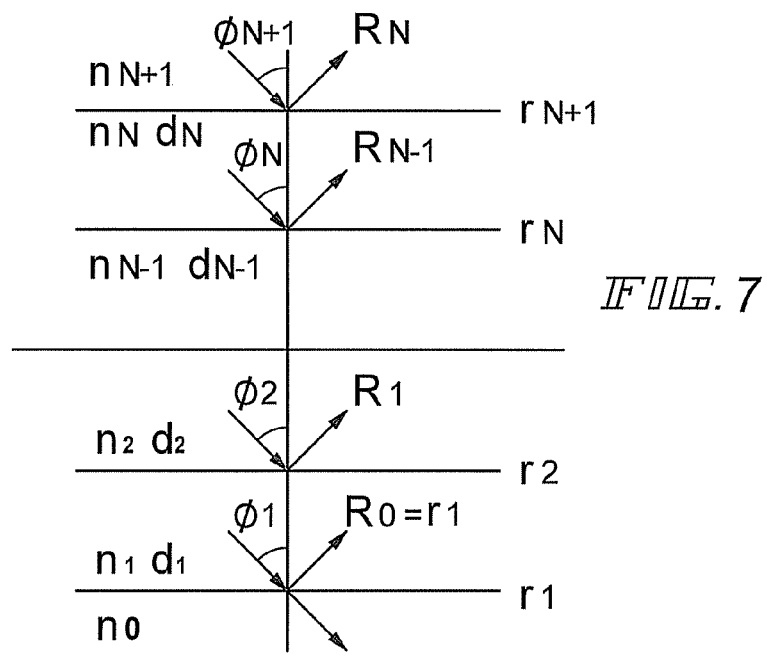

FIG. 7 is a model diagram of a multilayer film. (Embodiment Mode)

Figure 8:
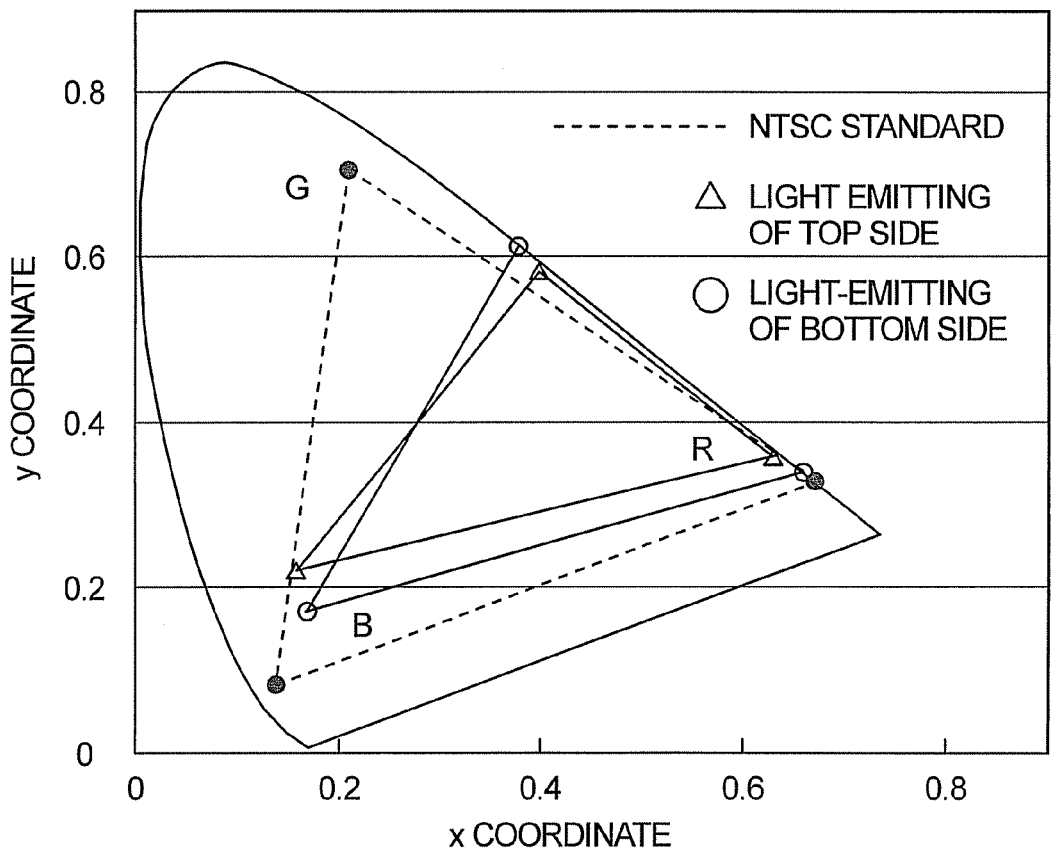

FIG. 8 is a comparing diagram of a color coordinate. (a comparative example)

DETAILED DESCRIPTION OF THE PREFERRED EMBODIMENTS

Embodiment Mode

An embodiment mode of the present invention is described below.

Figure 1:
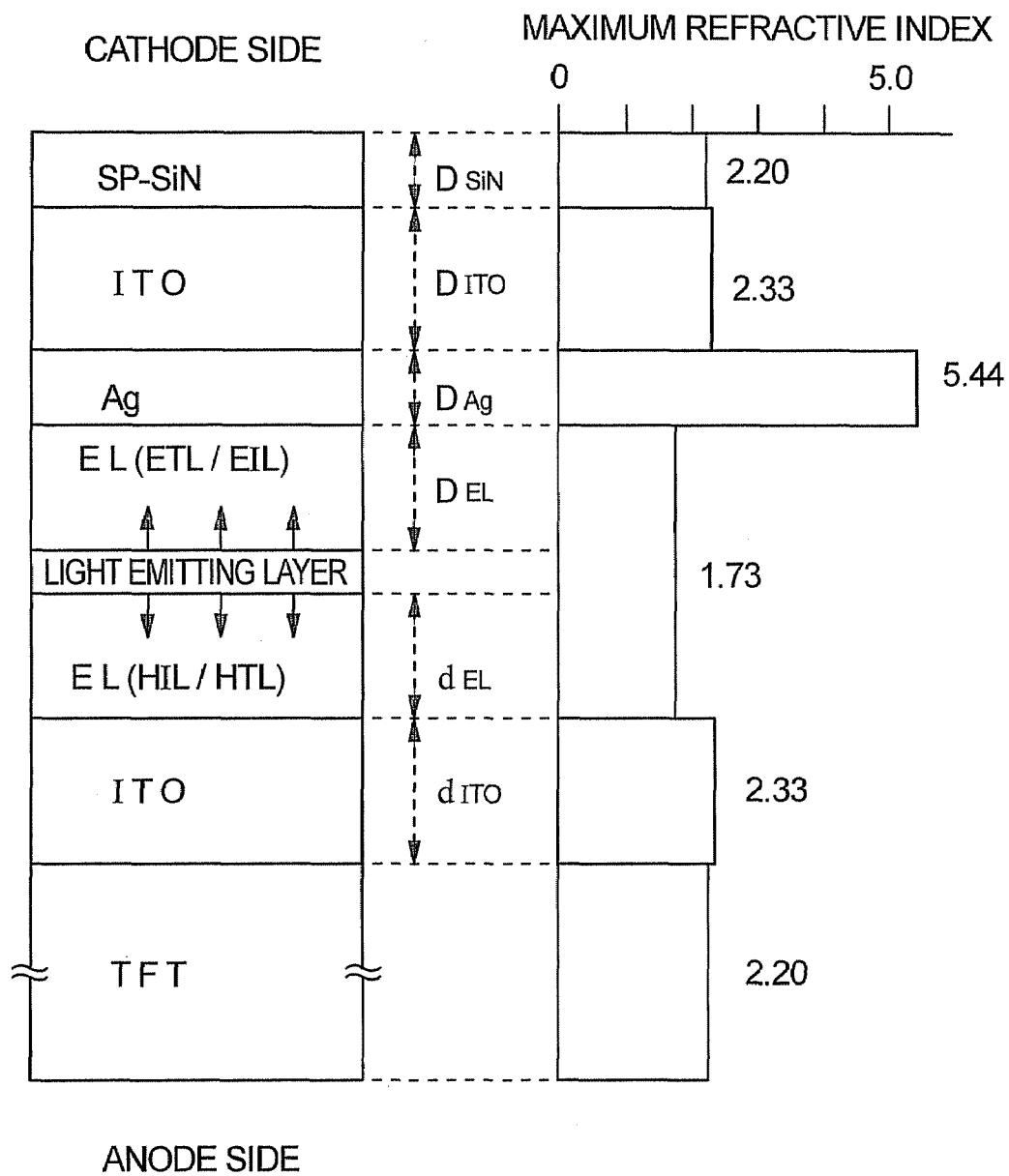
FIG. 1 is a model diagram of a laminated layer of an EL device. (Embodiment Mode)

Simulation is performed by using a laminated layer model shown in FIG. 1.

The inventors find that a color tone of luminescence from a top surface and luminescence from a bottom surface can be the same by adjusting a film thickness of a layer common to EL devices of three kinds (R, G, and B), namely, a film thickness of a metal thin film to be a cathode and a film thickness of a transparent conductive film to be formed thereupon, which leads to the present invention.

As shown in FIG. 1, an EL layer is divided into a cathode side and an anode side using a light-emitting interface of a light-emitting layer as a boundary in an EL element that an anode of ITO, a layer including a plurality of organic compounds including a light-emitting layer (EL layer), a cathode of a metal thin film (Ag), a transparent electrode of ITO, and a protective film of SiN are sequentially laminated. A refractive index of a material is different depending on wavelength, and value of the maximum refractive index is shown in FIG. 1.

Light toward an anode from a light-emitting interface of a light-emitting layer passes an anode, a layer including a TFT, and a transparent substrate to contribute to external luminescence. Light toward a cathode from a light-emitting interface of a light emitting layer passes a metal thin film, a transparent electrode, a protective film, a space, and a transparent substrate to contribute to external luminescence.

A refractive index difference between an EL layer and a metal thin film comprising Ag and a refractive index difference between a transparent electrode and a metal thin film comprising Ag are remarkably larger than a refractive index difference of other adjacent layers. The present invention adjusts a film thickness of a metal thin film and a transparent electrode to adjust luminescence from a cathode side and luminescence from an anode side.

As for luminescence provided from three light-emitting elements, a red light-emitting element having a peak at 620 nm, a green light-emitting element having a peak at 530 nm, and a blue light-emitting element having a peak at 450 nm are assumed to be used so as to perform a full color display. Practically, luminescence from an EL element shows not a steep peak but a wide spreading peak.

Finding transmittance, reflectance, and absorptance of luminescence from a top surface and luminescence from bottom surface respectively by simulation in three wavelength regions (620 nm, 530 nm, and 450 nm), in the case of using Ag as a metal thin film to be a cathode, the transmittance, the reflectance, and the absorptance of luminescence from a top surface and luminescence from a bottom surface can approximately be the same in each R, G, and B when Ag is set at from 6 nm to 10 nm, typically, 8 nm, and a transparent conductive layer (ITO) thereon is set at from 240 nm to 290 nm, from 380 nm to 500 nm, typically, 260 nm.

Thus, the present invention provides both luminescence to a top surface and luminescence to a bottom surface with an image display having an uniform color tone and high quality.

An EL layer is sequentially laminated an HIL (hole injection layer), an HTL (hole transport layer), an EML (light-emitting layer), an ETL (electron transport layer), and an EIL (electron injection layer) from an anode side in this order. Specifically, CuPc as an HIL, α-NPD as an HTL, BCP as an ETL, BCP:Li as an EIL are used respectively. As for an EML, $Alq_3$ doped with dopant corresponding to each luminescent color of R, G, and B may be used.

When a film thickness of Ag is equal to or less than 5 nm, electrical resistivity is increased. Ag is a material having a preferable ohmic contact. Further, Ag is effective in protecting an EL layer from damage by sputtering of ITO to be formed subsequently. In addition, when a film thickness of Ag is equal to or more than 11 nm, transmittance of light is unfavorably decreased. Ag is a material wherein good adhesion and stable film quality can be obtained easily even if a film thickness is thin by adjusting a deposition rate. When a transparent conductive layer (ITO) is less than 240 nm, a difference is caused in the transmittance, the reflectance, and the absorptance of luminescence from a top surface and luminescence from a bottom surface. Considering duration of the deposition, a transparent conductive layer (ITO) is preferably thinner than 500 nm.

Figure 3A:
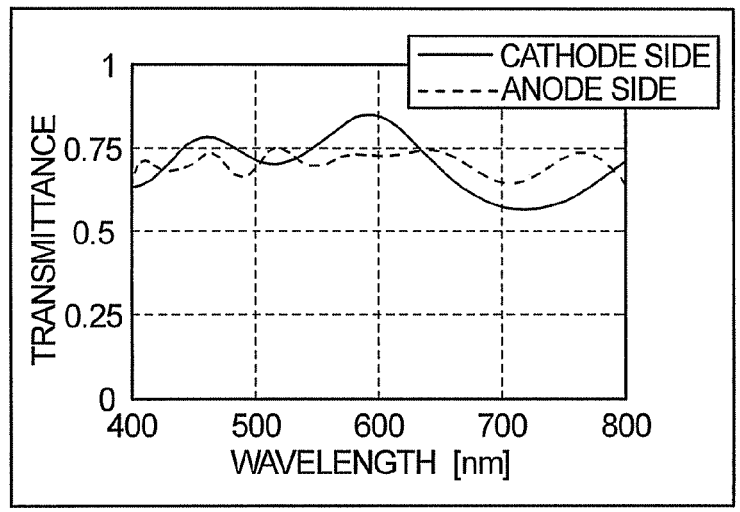
FIGS. 3A to 3C are diagrams showing transmittance, absorptance, and reflectance. (Embodiment Mode)
Figure 3B:
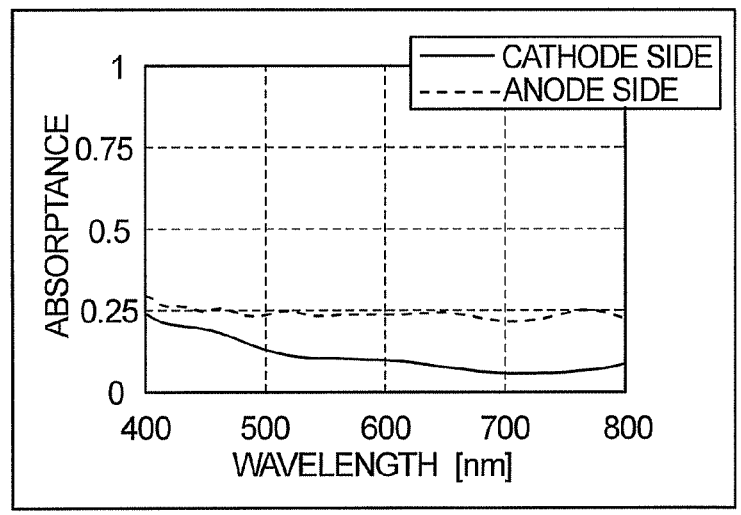
Figure 3C:
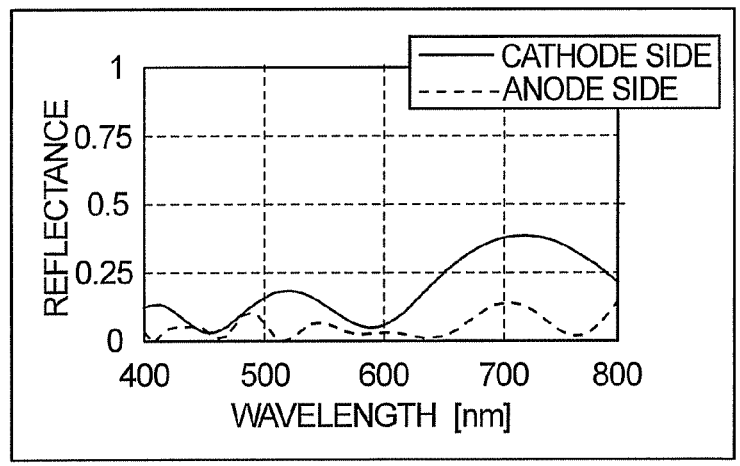

In each of R, G, and B, the transmittance, the reflectance and the absorptance of luminescence from a top surface and luminescence from a bottom surface can approximately be the same when a film thickness of Ag is 8 nm and a film thickness of a transparent conductive layer is 260 nm. The thickness of each layers are shown in FIG. 2. As shown in FIG. 2, luminescence of an anode side is assumed to sequentially pass an EL layer of 33 nm, ITO of 110 nm, a silicon nitride film of 100 nm, an acrylic resin of 1000 nm, a silicon oxynitride film of 100 nm, a silicon oxide film of 110 nm, a silicon nitride oxide film of 100 nm, a silicon oxynitride film of 50 nm, and a glass substrate. Luminescence of a cathode side is assumed to sequentially pass an EL layer of 90 nm, Ag of 8 nm, ITO of 260 nm, a silicon nitride film of 100 nm, and a glass substrate. Air between a glass substrate and a silicon nitride film is assumed to be 0 nm in thickness, namely, to have no thickness. Transmittance, reflectance, and absorptance in the case of being set at predetermined values in FIG. 2 are shown in FIGS. 3A to 3C.

Simulation of a multilayer film is performed with following procedures to find the reflectance and the transmittance.

Considering an N-layer multilayer film as shown in FIG. 7, reflectance from a first layer is represented in an equation [1].

$$R_1 = (r_2 + r_1 \exp(-2i\delta_1))/(1 + r_2 r_1 \exp(-2i\delta_1)) \quad [1]$$

Considering a first layer as a boundary having reflectance expressed in $R_1$, reflectance from a second layer is represented in an equation [2].

$$R_2 = (r_3 + R_1 \exp(-2i\delta_2))/(1 + r_3 R_1 \exp(-2i\delta^2)) \quad [2]$$

Reflectance of a multilayer film can be obtained by sequentially following the above-described procedures to a top layer. In actual simulation, a program is created by making a following recurrence formula subroutine.

$$R_j = (r_{j+1} + R_{j-1} \exp(-2i\delta_j))/(1 + r_{j+1} R_{j-1} \exp(-2i\delta_j))$$

$$R_0 = r_1, \delta_j = (2\pi/\lambda) n_j d_j \cos \phi_j \quad [3]$$

But, $\cos \phi_j = 1$ in simulation in the present embodiment mode wherein only a case of vertical incidence is supposed. Transmittance can be also obtained by a similar procedure. A recurrence formula of the transmittance is represented in an equation [4].

$$T_j = T_{j+1} t_{j-1} \exp(-i\delta_j)/(1 + r_{j+1} R_{j-1} \exp(-2i\delta_j)) T_N = t_N, \delta_j = (2\pi/\lambda) n_j d_j \cos \phi_j \quad [4]$$

Note that, $\cos \phi_j = 1$ as for the transmittance.

Following the above-described procedures, reflectance and transmittance of a multilayer film can be found. Absorptance can be found by 1−(reflectance+transmittance).

An example using Ag for a metal thin film is shown here, but a material having a small work function, for example, Al, Li, or Ca, or an alloy thereof, MgAg, MgIn, AlLi, $CaF_2$, or CaN can be used. In addition, an example using ITO (indium tin oxide) for a transparent electrode is shown here, but indium oxide-zinc oxide alloy ($In_2O_3$—ZnO), zinc oxide (ZnO), ITSO (indium tin oxide including Si), and the like can be used. In the case of using these materials, a film thickness may be decided in consideration of a refractive index of a material.

The present invention can be applied to a light-emitting device providing a full color display by combining an EL device of white luminescence and a color filter, and a light-emitting device providing a full color display by combining an EL device of blue luminescence and a color conversion layer, not limited to a light-emitting device providing a full color display with the use of EL devices of three kinds (R, G, and B).

The present invention comprising the above-described constitution is explained in detail in following Embodiments.

Embodiment 1

In the present embodiment, a dual emission type light-emitting device is described with reference to FIGS. 4A to 4C.

Figure 4A:
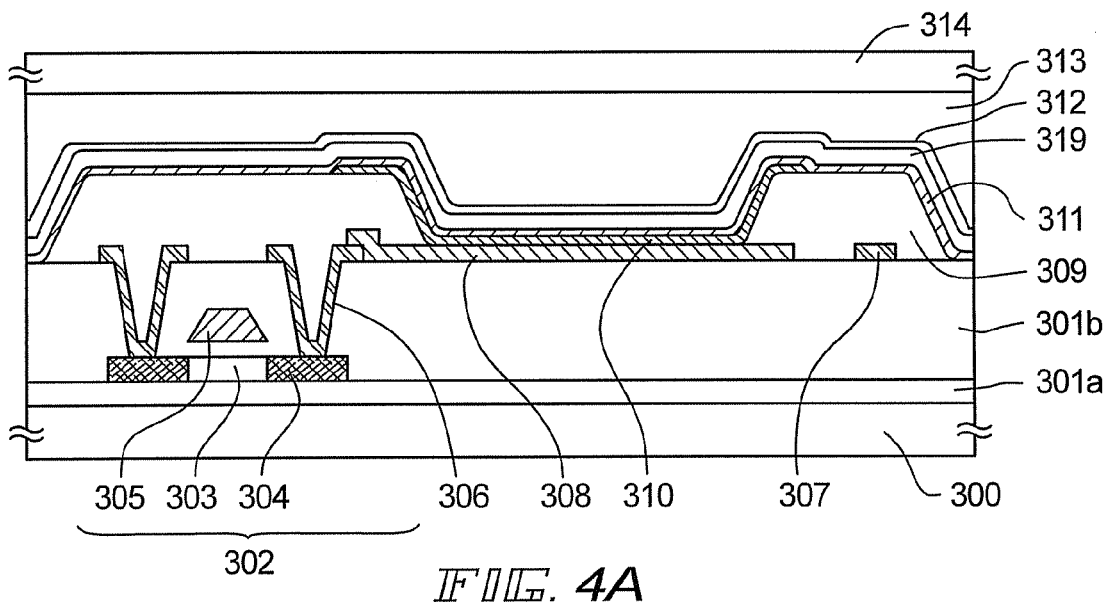
FIGS. 4A and 4B are cross-sectional views showing a TFT and an EL device.
Figure 4B:
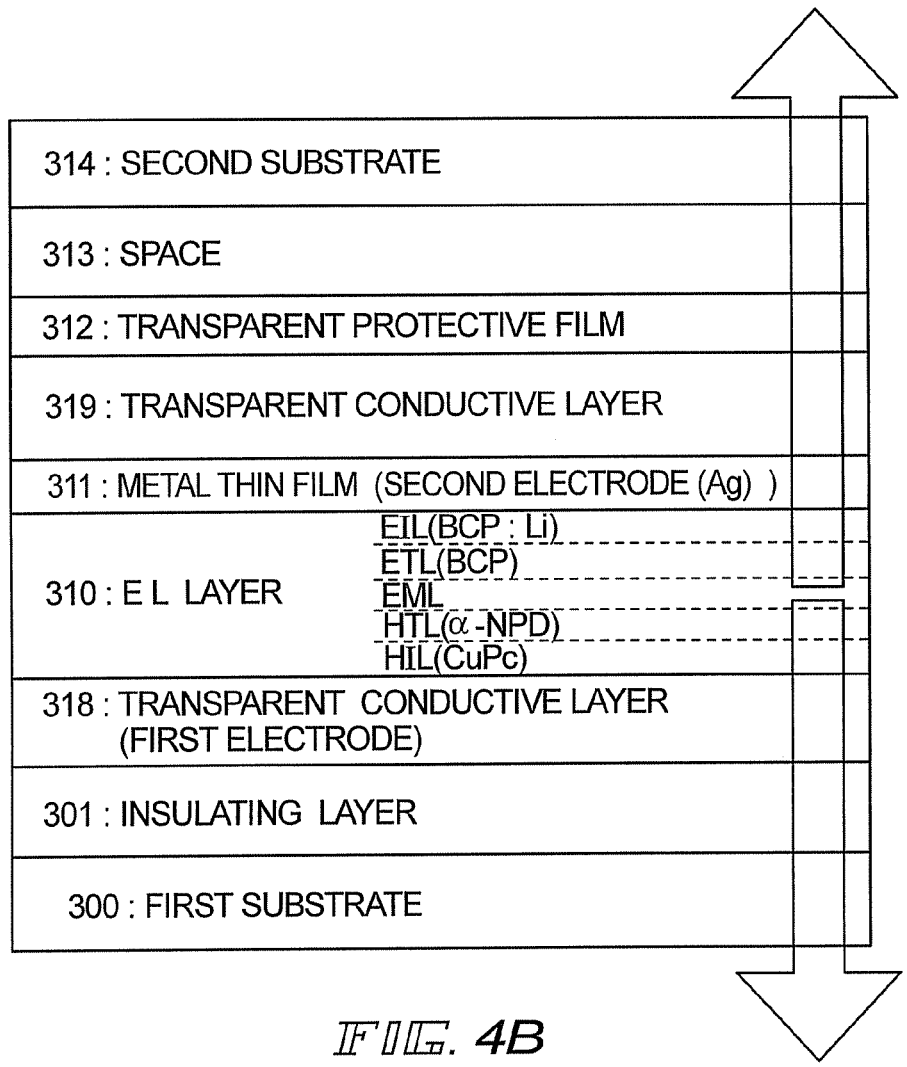

FIG. 4A is a cross-sectional view of a part of a pixel portion. FIG. 4B shows a simplified view of a laminated structure in a light-emitting region. Luminescence can be emitted to both a top surface and a bottom surface as shown in FIG. 4B. Note that, as for a configuration of a light-emitting region, namely, a configuration of a pixel electrode, a stripe arrangement, a delta arrangement, a mosaic arrangement and the like are mentioned.

In FIG. 4A, reference numeral 300 denotes a first substrate, 301a and 301b denote insulating layers, 302 denotes a TFT, 318 denotes a first electrode (transparent conductive layer), 309 denotes an insulator (referred to as a partition, a mound), 310 denotes an EL layer, 311 denotes a second electrode, 319 denotes a transparent conductive layer, 312 denotes a transparent protective layer, 313 denotes a space, and 314 denotes a second substrate.

A TFT 302 (P-channel type TFT) disposed on a first substrate 300 is a device to control current flowing to an EL layer 310 emitting light, and reference numeral 304 denotes a drain region (or a source region). Reference numeral 306 denotes a drain electrode (or a source electrode) connecting a first electrode to a drain region (or a source region). A wiring 307 such as a power supply wiring and a source wiring is formed simultaneously in the same step as the drain electrode 306. An example in which the first electrode and the drain electrode are formed separately is described in the present embodiment; however, these electrodes may be formed at the same time. The insulating layer 301a to be a base insulating film (a lower layer thereof and an upper layer thereof are herein referred to as a nitride insulating film and an oxide insulating film, respectively) is formed on the first substrate 300, while a gate insulating film is provided between a gate electrode 305 and an active layer. Further, reference numeral 301b denotes an interlayer insulating film comprising an organic material or an inorganic material. Although not illustrated here, one TFT (N-channel type TFT or P-channel type TFT) or a plurality of TFTs is provided per pixel. A TFT having one channel-forming region 303 is described in the present embodiment; however, a TFT is not limited to this type and a TFT may have a plurality of channels.

Although herein, a top gate type TFT is exemplified, the present invention can be applied regardless of a TFT structure, for example, the present invention can be applied to a bottom gate type (inverse stagger type) TFT and a forward stagger type TFT.

Reference numeral 318 denotes a first electrode comprising a transparent conductive film, namely, an anode (or a cathode) of an EL device. ITO (indium tin oxide), indium oxide-zinc oxide alloy ($In_2O_3$—ZnO), zinc oxide (ZnO), and the like can be used as for a transparent conductive film.

The light-emitting device has the insulator 309 (referred to as a bank, a partition, a barrier, a mount, and the like) covering an edge portion of the first electrode 318 (and the wiring 307). An inorganic material (such as silicon oxide, silicon nitride, and silicon oxynitride), a photosensitive organic material or a non-photosensitive organic material (such as polyimide, acrylic, polyamide, polyimidamide, resist, or benzocyclobutene), a laminate of these materials, or the like can be used as the insulator 309. A photosensitive organic resin covered with a silicon nitride film is used here. A curved surface having a curvature radius only in an upper edge portion of the insulator is preferably provided in the case of using a positive type photosensitive acrylic as the organic resin material, for example. Further, a negative type photosensitive organic material that becomes insoluble in etchant by photosensitive light, and a positive type photosensitive organic material that becomes soluble in etchant by light, can be used as the insulator.

In addition, a layer including an organic compound 310 is formed by applying a vapor deposition or an application. According to the present embodiment, an uniform film thickness is provided by forming the layer including the organic compound 310 in a vapor deposition device. Note that, deaeration is preferably conducted by performing vacuum heat treatment (from 100° C. to 250° C.) just before forming the layer including the organic compound 310, in order to improve reliability. For example, when a vapor deposition is used, a vapor deposition is performed in a film formation chamber that is vacuum-evacuated to a pressure equal to or less than $5 \times 10^{-3}$ Torr (0.665 Pa), preferably from $10^{-6}$ Pa to $10^{-4}$ Pa. The organic compound is vaporized in advance by resistance heating in a vapor deposition, and is scattered toward a substrate by opening a shutter at the time of a vapor deposition. The vaporized organic compound is scattered upward, and is deposited on the substrate after passing through an opening portion formed in a metal mask.

An EL layer (the layer including the organic compound) 310 is sequentially laminated with in order of an HIL (hole injection layer), an HTL (hole transport layer), an EML (light emitting layer), an ETL (electron transport layer), and an EIL (electron injection layer) from an anode side. Typically, CuPc as an HIL, α-NPD as an HTL, BCP as an ETL, BCP:Li as an EIL are used respectively.

As for the EL layer (the layer including the organic compound) 310, in the case of a full color display, specifically, a material layer showing luminescence of red, green, and blue may be deposited appropriately and selectively by a vapor deposition with the use of a deposition mask or by an ink-jetting respectively.

Without being limited to a laminated structure of the above-described EL layer, when the layer 310 including the organic compound showing green luminescence is formed, after depositing α-NPD to be 60 nm in thickness, using the same deposition mask, $Alq_3$ doped with DMQD is deposited as a green light-emitting layer to be 40 nm in thickness, $Alq_3$ is deposited as an electron transport layer to be 40 nm in thickness, and then $CaF_2$ is deposited as an electron injection layer to be 1 nm in thickness. When the layer 310 including an organic compound showing blue luminescence is formed, after depositing α-NPD to be 60 nm in thickness, BCP is deposited as a blocking layer to be 10 nm using the same mask. Further, $Alq_3$ is deposited as an electron transport layer to be 40 nm, and then $CaF_2$ is deposited as an electron injection layer to be 1 nm. When the layer 310 including the organic compound showing red luminescence is formed, after depositing α-NPD to be 60 nm in thickness, $Alq_3$ doped with DCM is deposited as a red light emitting layer to be 40 nm using the same mask. Further, $Alq_3$ is deposited as an electron transport layer to be 40 nm, and then $CaF_2$ is deposited as an electron injection layer to be 1 nm.

A light emitting display device capable of performing a full color display may be made by separately providing a color filter, a color conversion layer and the like for white color light emission. In the case that it is used as a display device or a lighting device performing only a simple display, it may be made a single color light emission (typically, white color light emission). For example, 1, 3, 4-oxadiazole derivative (PBD) having an electron transportation characteristic may be dispersed into polyvinyl carbazole (PVK) having a hole transportation characteristic. Moreover, white color light emission is obtained by dispersing 30 wt % of PBD as an electron transportation agent and by dispersing a suitable amount of four kinds of pigments (TPB, coumarin 6, DCM1, and Nile red). A white color light emission can be obtained as a whole by appropriately selecting an organic compound films that emits red light, green light, or blue light, and then, by superimposing them and mixing the colors.

Reference numeral 311 denotes a second electrode comprising a conductive film, namely, a cathode (or an anode). An alloy such as MgAg, MgIn, AlLi, $CaF_2$, and CaN, or a transparent metal thin film formed by a co-vapor deposition of aluminum with an element belonging to group 1 or group 2 of the periodic table, may be used as a material for the second electrode 311. A dual emission type light-emitting device that emits light by passing through the second electrode is manufactured here, and thus a from 6 nm to 10 nm thick aluminum film or an aluminum film having a minute amount of Li is used. In the case of using an Al film to form the second electrode 311, a material in contact with the layer 310 containing the organic compound can be formed of except oxide. As a result, reliability of the light-emitting device can be improved. A transparent layer (a thickness from 1 nm to 5 nm) comprising $CaF_2$, $MgF_2$, or $BaF_2$ as a cathode buffer layer can be formed before forming an aluminum film having thickness from 6 nm to 10 nm.

A transparent conductive film (such as ITO (indium tin oxide), indium oxide-zinc oxide alloy ($In_2O_3$—ZnO), zinc oxide (ZnO), and the like) may be formed on a metal thin film of from 6 nm to 10 nm in a film thickness ranging from 240 nm to 290 nm, or from 380 nm to 500 nm, in order to identify transmittance, absorptance, and reflectance of luminescence from a top surface and luminescence from a bottom surface and to lower resistance of a cathode. In this way, a difference between a display of luminescence from a top surface and a display of luminescence from a bottom surface is eliminated. An auxiliary electrode may be disposed on the second electrode 311 in a region not to be a light-emitting region in order to lower resistance of a cathode. When the cathode is formed, the cathode is selectively formed using a vapor deposition mask by resistance heating due to the vapor deposition.

Reference numeral 312 denotes a transparent protective layer formed by sputtering or vapor deposition and becomes a sealing film which not only protects the second electrode 311 comprising a metal thin film but also prevents penetration of moisture. As for a transparent protective film 312, a silicon nitride film, a silicon oxide film, a silicon oxynitride film (SiNO film (component ratio: N>O), or SiON film (component ratio: N<O)), and a thin film containing carbon as a main component (for example, a DLC film, or a CN film), which are obtained by sputtering or CVD, can be used. These inorganic insulating films have a high blocking effect against moisture; however, as a film thickness thereof is increased, a film stress is increased, and therein, they tend to be peeled or removed as a film.

Thus formed transparent protective layer 312 is the most suitable as a sealing film of a light-emitting device using a layer including an organic compound for a light-emitting layer. The second substrate 314 and the first substrate 310 are pasted together by a sealing material comprising a gap material for securing a space between the substrates.

As a protective layer, a protective layer comprising a laminated layer with a first inorganic insulating film, a stress relaxation film, and a second inorganic insulating film may be formed on a cathode. For example, after the cathode is formed, the first inorganic insulating film is formed to be 5 nm to 50 nm, a stress relaxation film (such as a layer including an organic compound) having hygroscopicity and transparency is formed by a vapor deposition, and then, the second inorganic insulating film is formed again to be 5 nm to 50 nm. A deposition of a laminated layer with a stress relaxation film and an inorganic insulating film may be repeatedly laminated equal to or more than twice.

According to the present embodiment, a plastic substrate selected from such as FRP (Fiberglass-Reinforced Plastics), PVF (polyvinylfluoride), myler, polyester or acrylic can be used as a material composing a second substrate 314 other than a glass substrate and a quartz substrate.

An example that an interspace of a pair of substrates is a space (inert gas) 313 is described in the present embodiment, but a transparent sealing material may be filled between the pair of substrates. There are no particular limitations for a sealing material to fill, as long as the material is transparent. Typically, an ultraviolet curing epoxy rein or a heat curing epoxy resin may be used. Here, a highly heat resistant UV epoxy resin (product name: 2500 Clear, manufactured by Electrolite Cooperation) having an index of refraction equal to 1.50, a viscosity equal to 500 cps, a Shore D hardness equal to 90, a tensile strength equal to 3000 psi, a Tg point of 150° C., a volumetric resistivity equal to $1 \times 10^{15}$ Ω·cm, and a withstand voltage of 450 V/mil is used. In addition, total transmittance can be improved by filling a transparent sealing material between a pair of substrates, compared to a case that an interspace between the pair of substrates is a space (inert gas).

The present embodiment can be freely combined with the embodiment mode.

Embodiment 2

According to the present embodiment, an example of a portable electronic appliance comprising equal to or more than two display devices is described. FIG. 5A is a side view, and FIG. 5B is a perspective view. A mobile phone shown in FIGS. 5A and 5B comprises a first display device 401 of high quality mainly displaying a color pictorial image and a second display device 402 mainly displaying characters and symbols.

As shown in FIGS. 5A and 5B, the portable electronic appliance may be one in which a first display device 401 and a second display device 402 are attached each other so as to allow opening and closing freely and so as to sandwich a third display device 403. The third display device 403 can display on both sides. The third display device 403 of a dual emission type can be provided according to the embodiment 1.

An electronic appliance shown in FIGS. 5A and 5B is a portable electronic appliance in which a cover member having the first display device for displaying an image (digital still image or the like) and the second display device having a touch input operational portion (for displaying characters, symbols, or the like) are attached to each other so as to allow opening and closing freely. The mobile phone shown in FIGS. 5A and 5B is collapsible so as to protect a display portion.

At least one of the first display device 101 and the second display device 102 has a touch input operational portion. A screen in which the touch input operational portion is provided has a function of an operational switch.

In FIG. 5B, reference numeral 404 denotes an operational switch, 405 denotes a voice output portion, 406 denotes a voice input portion, and 407 denotes an antenna.

The first display device, or the second display device may be provided with a sensor for authentication of users. As the authentication of users, living body information (typically, fingerprint, palmar pattern, voice print, or the like) may be utilized.

Note that, a liquid crystal display device or an EL display device can be used as the first display device and the second display device.

The present embodiment can be freely combined with the embodiment mode or Embodiment 1.

Embodiment 3

According to the present embodiment, an example using an optical film so as not to be transparent to see a background therethrough is shown in FIG. 6 as for a dual emission panel.

FIG. 6A shows a cross-sectional view of a light-emitting device, and FIG. 6B shows a perspective view thereof. A light-emitting panel 1801 is sandwiched between polarizing plates 1802 and 1803 so as to prevent outside light from passing. The two pieces of polarizing plates can cut off outside light by being disposed perpendicular to a direction of polarization. Light from a light-emitting panel 1801 can perform a display because it passes only one piece of polarizing plates.

In this way, a light-emitting panel except a light-emitting portion to perform a display becomes black not to be transparent to see a background, even if the display is watched from either side.

In FIGS. 6A and 6B, the polarizing plates 1802 and 1803 are disposed so as to have a space with the light-emitting panel 1801, but not particularly limited thereto; the polarizing plates may be disposed so as to be in contact with the light-emitting panel 1801.

The present embodiment can be freely combined with the embodiment mode, Embodiment 1, or Embodiment 2. For example, when the present embodiment is applied to the third display device 403 described in Embodiment 2, a display can be prevented from being hard to be recognized because of transparency to see a background when watched from one side.

Embodiment 4

By implementing the invention, various modules (an active matrix type liquid crystal module, an active matrix type EL module and an active matrix type EC module) can be fabricated. That is, by implementing the invention, all of electric appliances incorporated those modules can be completed.

As such electric appliances, a video camera, a digital camera, a head mount display (goggle type display), a car navigation, a projector, a car stereo, a personal computer, a portable information terminal (a mobile computer, a mobile phone, an electronic book, or the like) or the like can be given. A range of applying the present invention is extremely wide and is applicable to a method for manufacturing electric appliances of all fields. Further, the electric appliances of the present embodiment can be realized by combining with any one of the Embodiment Modes, and Embodiments 1 to 3.

According to the present invention, a dual emission type light-emitting device providing both luminescence to a top surface and luminescence to a bottom surface with an image display having an uniform color tone and of high quality can be realized.

What is claimed is:

1. A light-emitting device comprising:
    a first light-emitting element for emitting a red color comprising a first electrode, a first layer including an organic compound and touching the first electrode, and a second electrode touching the first layer including the organic compound;
    a second light-emitting element for emitting a green color comprising a third electrode, a second layer including an organic compound and touching the third electrode, and a fourth electrode touching the second layer including the organic compound;
    a third light-emitting element for emitting a blue color comprising a fifth electrode, a third layer including an organic compound and touching the fifth electrode, and a sixth electrode touching the third layer including the organic compound; and
    a first transparent substrate and a second transparent substrate which sandwich the first to third light-emitting elements,
    wherein luminescence passing the first electrode and the first transparent substrate and luminescence passing the second electrode and the second transparent substrate are the same in a color coordinate,
    wherein luminescence passing the third electrode and the first transparent substrate and luminescence passing the fourth electrode and the second transparent substrate are the same in the color coordinate, and
    wherein luminescence passing the fifth electrode and the first transparent substrate and luminescence passing the sixth electrode and the second transparent substrate are the same in the color coordinate.

2. A light-emitting device according to claim 1, wherein one of the first electrode and the second electrode is a cathode and the other is an anode of the first light-emitting element,
    wherein one of the third electrode and the fourth electrode is a cathode and the other is an anode of the second light-emitting element, and
    wherein one of the fifth electrode and the sixth electrode is a cathode and the other is an anode of the third light-emitting element.

3. The light emitting device according to claim 2, wherein the cathode includes Ag, and wherein a transparent conductive layer is formed over the cathode.

4. The light emitting device according to claim 3, wherein a thickness of the cathode is within a range of 6 nm to 10 nm, and
    wherein a thickness of the transparent conductive layer is within a range of 240 nm to 290 nm.

5. The light emitting device according to claim 3, wherein a thickness of the cathode is within a range of 6 nm to 10 nm, and
    wherein a thickness of the transparent conductive layer is within a range of 380 nm to 500 nm.

6. A light-emitting device according to claim 1, wherein number of layers to be passed is different between light transmitted through the first electrode and light transmitted through the second electrode,
    wherein number of layers to be passed is different between light transmitted through the third electrode and light transmitted through the fourth electrode, and
    wherein number of layers to be passed is different between light transmitted through the fifth electrode and light transmitted through the sixth electrode.

7. A light-emitting device according to claim 1, wherein a TFT is connected to the first electrode or the second electrode,
    wherein a TFT is connected to the third electrode or the fourth electrode, and
    wherein a TFT is connected to the fifth electrode or the sixth electrode.

8. A light-emitting device according to claim 1, wherein one of the first electrode and the second electrode is a transparent conductive film, the other is a metal thin film transmitting light,
    wherein one of the third electrode and the fourth electrode is a transparent conductive film, and the other is a metal thin film transmitting light, and
    wherein one of the fifth electrode and the sixth electrode is a transparent conductive film, and the other is a metal thin film transmitting light.

9. An electronic appliance including the light-emitting device according to claim 1, wherein the light-emitting device is selected from the group consisting of a video camera, a digital camera, a car navigation, a personal computer, or a portable information terminal.

10. A light-emitting device comprising;
    a pixel portion having a plurality of light-emitting elements of white having a first electrode, a layer including an organic compound and touching the first electrode, and a second electrode touching the layer including the organic compound;

two color filters which sandwich the light-emitting element of white, and a first transparent substrate and a second transparent substrate which sandwich the plurality of light-emitting elements of white, wherein luminescence passing the first electrode and the first transparent substrate is used for displaying an image on a first display surface, wherein luminescence passing the second electrode and the second transparent substrate is used for displaying the image on a second display surface, and wherein transmitted light of three colors transmitted through each the two color filters form approximately the same triangles in a color coordinate as for both luminescence passing a first electrode and luminescence passing a second electrode.

11. A light-emitting device according to claim 10, wherein one of the first electrode and the second electrode is a cathode and the other is an anode of a light-emitting element layer including an organic compound.

12. The light emitting device according to claim 11, wherein the cathode includes Ag, and wherein a transparent conductive layer is formed over the cathode.

13. The light emitting device according to claim 12, wherein a thickness of the cathode is within a range of 6 nm to 10 nm, and wherein a thickness of the transparent conductive layer is within a range of 240 nm to 290 nm.

14. The light emitting device according to claim 12, wherein a thickness of the cathode is within a range of 6 nm to 10 nm, and wherein a thickness of the transparent conductive layer is within a range of 380 nm to 500 nm.

15. A light-emitting device according to claim 10, wherein number of layers to be passed is different between light transmitted through the first electrode and light transmitted through the second electrode.

16. A light-emitting device according to claim 10, wherein a TFT is connected to the first electrode or the second electrode.

17. A light-emitting device according to claim 10, wherein one of the first electrode and the second electrode is a transparent conductive film, other one of the first electrode and the second electrode is a metal thin film transmitting light.

18. An electronic appliance including the light-emitting device according to claim 10, wherein the light-emitting device is selected from the group consisting of a video camera, a digital camera, a car navigation, a personal computer, or a portable information terminal.

19. A light-emitting device comprising;

a pixel portion having a plurality of light-emitting elements of white having a first electrode, a layer including an organic compound and touching the first electrode, and a second electrode touching the layer including the organic compound;

two color filters which sandwich the light-emitting element of white; and a first transparent substrate and a second transparent substrate which sandwich the plurality of light-emitting elements of white, wherein luminescence passing the first electrode and the first transparent substrate is used for displaying an image on a first display surface, and wherein luminescence passing the second electrode and the second transparent substrate is used for displaying the image on a second display surface.

20. A light-emitting device according to claim 19, wherein one of the first electrode and the second electrode is a cathode and the other is an anode of a light-emitting element layer including an organic compound.

21. The light emitting device according to claim 20, wherein the cathode includes Ag, and wherein a transparent conductive layer is formed over the cathode.

22. The light emitting device according to claim 21, wherein a thickness of the cathode is within a range of 6 nm to 10 nm, and wherein a thickness of the transparent conductive layer is within a range of 240 nm to 290 nm.

23. The light emitting device according to claim 21, wherein a thickness of the cathode is within a range of 6 nm to 10 nm, and wherein a thickness of the transparent conductive layer is within a range of 380 nm to 500 nm.

24. A light-emitting device according to claim 19, wherein number of layers to be passed is different between light transmitted through the first electrode and light transmitted through the second electrode.

25. A light-emitting device according to claims 19, wherein a TFT is connected to the first electrode or the second electrode.

26. A light-emitting device according to claim 19, wherein one of the first electrode and the second electrode is a transparent conductive film, other one of the first electrode and the second electrode is a metal thin film transmitting light.

27. An electronic appliance including the light-emitting device according to claim 19, wherein the light-emitting device is selected from the group consisting of a video camera, a digital camera, a car navigation, a personal computer, or a portable information terminal.

* * * * *